United States Patent [19]

Rybicki

[11] Patent Number: 4,912,427

[45] Date of Patent: Mar. 27, 1990

[54] POWER SUPPLY NOISE REJECTION TECHNIQUE FOR AMPLIFIERS

[75] Inventor: Mathew A. Rybicki, Austin, Tex.

[73] Assignee: Motorola, Inc., Schaumburg, Ill.

[21] Appl. No.: 285,276

[22] Filed: Dec. 16, 1988

[51] Int. Cl.[4] .......................... H03F 1/26; H03F 3/45
[52] U.S. Cl. .................................... 330/257; 330/149
[58] Field of Search ............... 330/149, 252, 253, 257, 330/260

[56] References Cited

U.S. PATENT DOCUMENTS 4,562,408 12/1985 Nagai .................................. 330/253

Primary Examiner—James B. Mullins
Attorney, Agent, or Firm—Robert L. King

[57] ABSTRACT

A circuit provides power supply noise cancellation by utilizing a correction capacitor coupled to a compensation input of the circuit. Power supply noise is introduced into an output of the circuit by inadvertently coupling an error voltage thru a capacitor to the output as a result of power supply voltage variation. A compensation charge is produced by the correction capacitor and a sub-amplifier of the circuit which, through charge transfer, cancels the error voltage at the output, thereby providing an output signal having substantially reduced power supply noise.

14 Claims, 7 Drawing Sheets

POWER SUPPLY NOISE REJECTION TECHNIQUE FOR AMPLIFIERS

FIELD OF THE INVENTION

This invention relates generally to amplifier circuits, and more particularly, to cancelling power supply noise in amplifier circuits, including operational amplifiers.

BACKGROUND OF THE INVENTION

Operational and differential amplifiers typically have an error voltage coupled to the circuit output resulting from noise and other variations existent in the power supply voltage. The error voltage is commonly associated with output gain stages which utilize a frequency compensation capacitor commonly referred to as "Miller" compensation. At sufficiently high frequency, the frequency compensation capacitor effectively becomes a short circuit connecting the gate and drain of an output transistor having a source thereof connected to a power supply voltage. In this diode configured arrangement, the output transistor has a substantially constant gate-to-source voltage. Therefore, any voltage variations in the power supply voltage are directly coupled to the drain of the output transistor which functions as the output of the amplifier. Others have proposed a variety of techniques to minimize the amount of error voltage from a power supply which is coupled to the output of an amplifier and thus improve the amplifier's power supply noise rejection. A cascoded operational amplifier with high power supply rejection is illustrated by David Ribner and Miles Copeland in "Design Techniques for Cascoded CMOS Op Amps with Improved PSRR and Common-Mode Input Range" in the IEEE Journal of Solid-State Circuits, Vol. SC-19, No. 6, pgs. 919-925, Dec. 1984 at page 919. However, as noted by Ribner and Copeland at page 923, there exists potential frequency stability problems when the cascode compensation is used. Another circuit for improving power supply rejection in an operational amplifier is taught by Roger Whatley in U.S. Pat. No. 4,713,625, assigned to the assignee hereof, wherein charge compensation in a non-signal path of the amplifier is utilized. In some applications, less circuitry than that used in the amplifier taught by Whatley is desired and less circuitry may also have additional benefits as additional circuitry can itself introduce errors into the signal path.

BRIEF DESCRIPTION OF THE INVENTION

Accordingly, it is an object of the present invention to provide an improved power supply noise rejection technique for operational amplifiers.

It is another object of the present invention to provide an improved operational amplifier structure which substantially eliminates power supply noise effects from the output signal.

Another object of the present invention is to provide an improved method for minimizing power supply noise in an operational amplifier.

In carrying out these and other objects of the invention, there is provided, in one form, an amplifier having high power supply noise rejection. An output portion provides an output signal having substantially no error component caused by power supply voltage variation. The output portion is coupled to first and second power supply voltage terminals for receiving first and second power supply voltages, respectively. The output portion also has a capacitive element for frequency compensation which inadvertently couples an error voltage to the output signal from the second power supply voltage. A sub-amplifier is provided having first and second inputs, a compensation input and an output. The first input and the output of the sub-amplifier are respectively coupled to first and second bias currents which also function as the signal path. The second input of the sub-amplifier is connected to a terminal adapted to receive the second power supply voltage. The output of the sub-amplifier couples a single signal to the output portion having both a signal component and a compensation component. The compensation component has a magnitude proportional to and opposite in polarity of the error voltage. A compensation capacitor has a first electrode coupled to the compensation terminal of the sub-amplifier and a second electrode coupled to a third power supply voltage terminal. The third power supply voltage terminal receives a third power supply voltage from which the output signal is referenced and which has a magnitude substantially midway between the first and second power supply voltages. The compensation capacitor has a predetermined capacitive value which is ratioed to the capacitive element of the output portion. An input stage is coupled to the first input and the output of the sub-amplifier. The input stage provides the first and second bias currents and also provides the signal component which is proportional to an input signal.

These and other objects, features and advantages will be more clearly understood from the following detailed description taken in conjunction with the accompanying drawings.

DETAILED DESCRIPTION OF THE INVENTION

Figure 1:
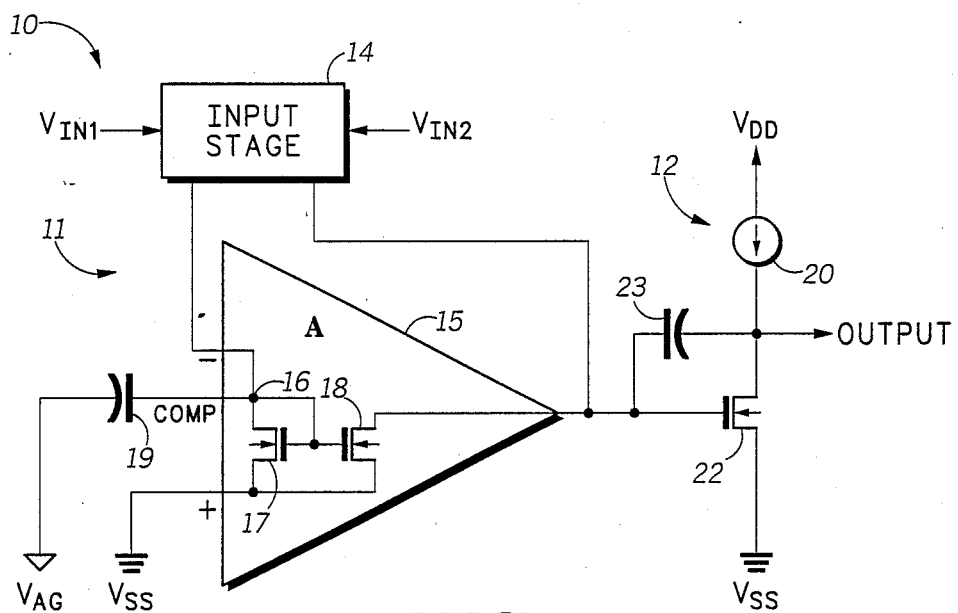
FIG. 1 illustrates in partial schematic form a known operational amplifier having power supply noise rejection in accordance with the present invention.

Shown in FIG. 1 is an amplifier circuit 10 generally comprising a known input portion 11 and an output portion 12. Input portion 11 comprises a transconductance input stage 14 having a first input for receiving a first input voltage, $V_{IN1}$, and a second input for receiving a second input voltage, $V_{IN2}$. First and second outputs of input stage 14 are connected to a sub-amplifier 15 generally labeled "A" which is a sub-amplifier of amplifier circuit 10. The first output of input stage 14 is connected at a node 16 to a drain of an N-channel transistor 17. Transistor 17 is configured as a diode by having the drain connected to a gate thereof. A source of transistor 17 is connected to a power supply voltage terminal for receiving a power supply voltage labeled "$V_{SS}$". An N-channel transistor 18 has a gate connected to the gate of transistor 17 at node 16. A source of transistor 18 is connected to the source of transistor 17. A drain of transistor 18 is used as a positive output of sub-amplifier 15 and is connected to the second output of input stage 14. Node 16 functions as an inverting or negative input of sub-amplifier 15 with respect to the output of sub-amplifier 15, and the sources of transistors 17 and 18 function as a noninverting or positive input of sub-amplifier 15 with respect to the output of sub-amplifier 15. Node 16 also forms a compensation input terminal labeled "Comp". A first electrode of a power supply noise correction capacitor 19 is connected to node 16, and a second electrode of correction capacitor 19 is connected to a power supply voltage terminal labeled "$V_{AG}$".

In output portion 12, a current source 20 has a first terminal connected to a third power supply voltage terminal labeled "$V_{DD}$", and has a second terminal connected to an output terminal for providing an output signal. An N-channel transistor 22 has a drain connected to the output terminal, a gate connected to the drain of transistor 18, and a source connected to the first power supply voltage terminal $V_{SS}$. A frequency compensation capacitor 23 has a first electrode connected to the output terminal and a second electrode connected to the gate of transistor 22. In a preferred form, power supply voltage $V_{DD}$ is more positive than power supply voltage $V_{SS}$, and power supply voltage $V_{AG}$ is substantially halfway between $V_{SS}$ and $V_{DD}$. The output signal is referenced to power supply voltage $V_{AG}$. The same convention will also be assumed for the remaining figures. Although specific N-channel and P-channel MOS devices are shown in FIG. 1 and subsequent figures, it should be clear that the present invention may be implemented by completely reversing the processing techniques (e.g. N-channel to P-channel) or by using other types of transistors.

In operation, the problem which operational amplifier circuit 10 corrects should first be understood. At other than low frequency, frequency compensation capacitor 23 functions substantially as a short circuit to configure transistor 22 as a diode. Transistor 22 is a current sink transistor biased thru current source 20 in output portion 12, and has a substantially constant gate-to-source voltage. Therefore, as noise sources cause power supply voltage $V_{SS}$ to vary in value, the gate of transistor 22 and the output terminal vary accordingly and of substantially equal value assuming current source 20 has a large output impedance. The power supply voltage variation causes an error to exist in the output of amplifier circuit 10. In the illustrated form, transconductance input stage 14 functions to receive two input voltages and provide first and second bias currents to the negative input and output of sub-amplifier 15, respectively, which are proportional to the input voltages. It should be well understood that input stage 14 may be implemented with only a single input signal and two bias output currents. Also, input stage 14 may be implemented as a conventional current mirror circuit to provide first and second bias currents to amplifier 15 in response to either a single or two input signals. An illustration of this configuration is provided in a subsequent figure.

To compensate for the power supply noise error, the positive input of sub-amplifier 15 also varies the same as $V_{SS}$ and the output terminal. Assume that power supply $V_{SS}$ increases in voltage as a result of power supply noise by $\Delta V$. Assume that transconductance input stage 14 is ideal meaning that input stage 14 has a high output impedance. Therefore, if the positive input of sub-amplifier 15 rises in voltage potential, so does the negative input of sub-amplifier 15 which is also the compensation input of sub-amplifier 15. Since the second electrode of correction capacitor 19 is connected to a fixed voltage potential $V_{AG}$, a charge displacement occurs on capacitor 19 wherein current flow is from sub-amplifier 15 to the $V_{AG}$ terminal, assuming the conventional standard positive charge current flow. Therefore, there is a resulting current flow thru transistor 17 from the source to the drain thereof, and a proportional current flows thru transistor 18 from the source to the drain as a result of the current mirroring effect of transistors 17 and 18. The current conducted by transistor 18 is coupled thru frequency compensation capacitor 23 and results in a change in voltage across correction capacitor 23, wherein the output terminal decreases by $\Delta V$. It is assumed that output stage 12 is a high gain stage so that the gate voltage of transistor 22 does not substantially vary. This $\Delta V$ change is equal in magnitude, but of opposite sign, to the increase in voltage at the output terminal which is coupled from $V_{SS}$ thru diode configured transistor 22, provided the capacitive value of capacitor 19 is substantially equal to the capacitive value of capacitor 23 plus any additional parasitic capacitance associated with the output terminal and the output of sub-amplifier 15 assuming transistors 16 and 18 are equal in size. Otherwise, correction capacitor 19 is size ratioed to capacitor 23 in proportion to the ratio of the sizes of transistors 17 and 18, respectively. Therefore, the increase in voltage at the output terminal resulting from power supply noise is cancelled by a correction capacitor 19 which is directly in the signal path of operational amplifier 19. Further, no additional circuitry has been added to operational amplifier 10 to accomplish the noise rejection other than adding a single capacitor which is carefully matched in value to the Miller frequency compensation capacitor in the output stage. It should be noted that if care is taken in physically sizing transistor 17 with the matched value of capacitor 19, the bandwidth of operational amplifier 10 may be set to optimize the frequency stability of operational amplifier 10.

Figure 2A:
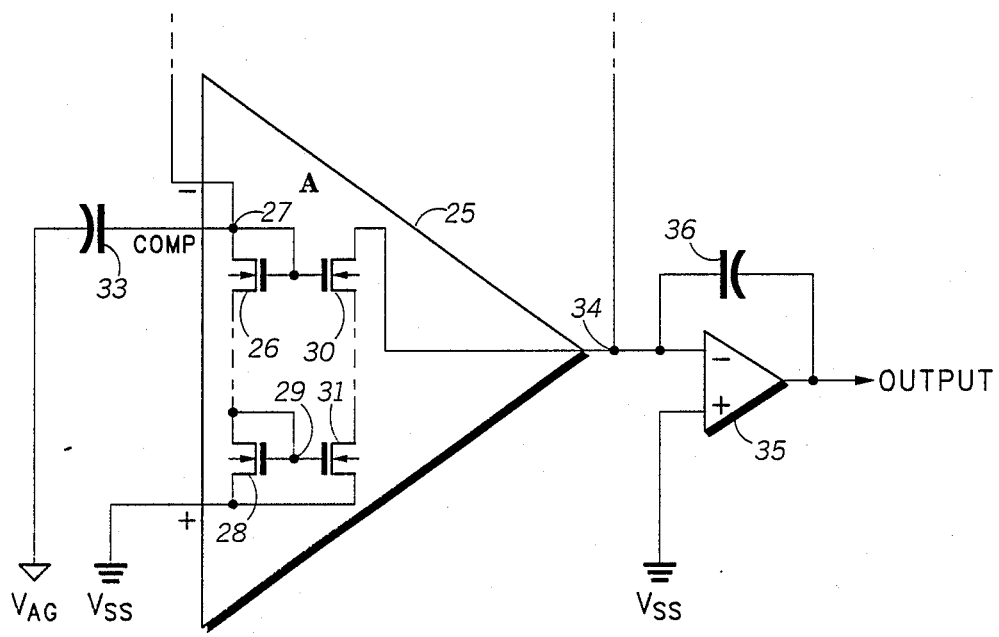
FIG. 2(A) illustrates in partial schematic form another known embodiment of the operational amplifier of FIG. 1, and FIG. 2(B) and 2(C) illustrate in partial schematic form an operational amplifier in accordance with the present invention.

Shown in FIG. 2(A) is an alternate embodiment of amplifier 15 and output portion 12 of FIG. 1. A sub-amplifier 25 comprises an N-channel transistor 26 having both a drain and a gate connected together at a node 27 which functions as an inverting or negative input of amplifier 25. In one form, a source of transistor 26 is connected to a drain of an N-channel transistor 28 at a node 29. A gate of transistor 28 is connected to the drain thereof so that both transistor 26 and transistor 28 are configured as diodes. An N-channel transistor 30 has a gate connected to the gate of transistor 26 at node 27. In one form, a source of transistor 30 is connected to a drain of an N-channel transistor 31. A gate of transistor 31 is connected to the gate of transistor 28, and a source of transistor 31 is connected to a source of transistor 28 to form a noninverting or positive input of sub-amplifier 25. The sources of transistors 28 and 31 are connected to power supply voltage $V_{SS}$. Node 27 also functions as a compensation input labeled "Comp" of sub-amplifier 25 and is connected to a first electrode of a correction capacitor 33. A second electrode of capacitor 33 is connected to a power supply voltage $V_{AG}$. A drain of transistor 30 functions as an output of sub-amplifier 25 and is connected to an inverting or negative input of an output amplifier 35 at a node 34. A noninverting or positive input of output amplifier 35 is connected to power supply voltage $V_{SS}$, and an output of output amplifier 35 provides a circuit output signal. A feedback capacitor 36 has a first electrode connected to the negative input of output amplifier 35 and has a second electrode connected to the output of output amplifier 35. In the illustrated form, the negative input and output of sub-amplifier 25 may be respectively connected to the first and second outputs of input stage 14 of FIG. 1 as noted by the dashed lines. Also, transistors 26, 30 and 28, 31 form a cascode structure which may be expanded as noted by the dashed lines with additional pairs of cascode transistors connected as the cascode pair of transistors 26 and 30 is connected.

In operation, an understanding of the source of error voltage will again provide insight into the operation of the present invention. Noise errors from power supply voltage $V_{SS}$ are coupled to the positive input of output amplifier 35 of the output stage. In response thereto, the negative input of output amplifier 35 varies the same way. Assume for the purpose of discussion only that the positive and negative inputs of output amplifier 35 increase in voltage potential by $\Delta V$. As a result, capacitor 36 couples a $\Delta V$ voltage error to the output of output amplifier 35.

In the illustrated form, sub-amplifier 25 is implemented by a cascode current mirror transistor structure. Transistors 26 and 30 are cascode transistors, and transistors 28 and 31 function as a current mirror. When power supply voltage $V_{SS}$ increases in value by $\Delta V$, so do the voltages at nodes 27 and 29. In response thereto, current is conducted by transistors 26 and 28 from the $V_{SS}$ power supply terminal thru transistors 28 and 26 and thru capacitor 33 to $V_{AG}$. This same current is mirrored thru transistors 31 and 30 to the output terminal 34 and to feedback capacitor 36. By size ratioing the correction capacitor 33 to be the same capacitive value as feedback capacitor 36 plus any associated parasitic capacitance, a charge transfer occurs placing the same voltage, $\Delta V$, onto feedback capacitor 36 in an opposite polarity as is provided from the $V_{SS}$ power supply at the inputs of output amplifier 35. Therefore, the power supply noise is canceled and the output signal has the error component removed therefrom.

Figure 2B:
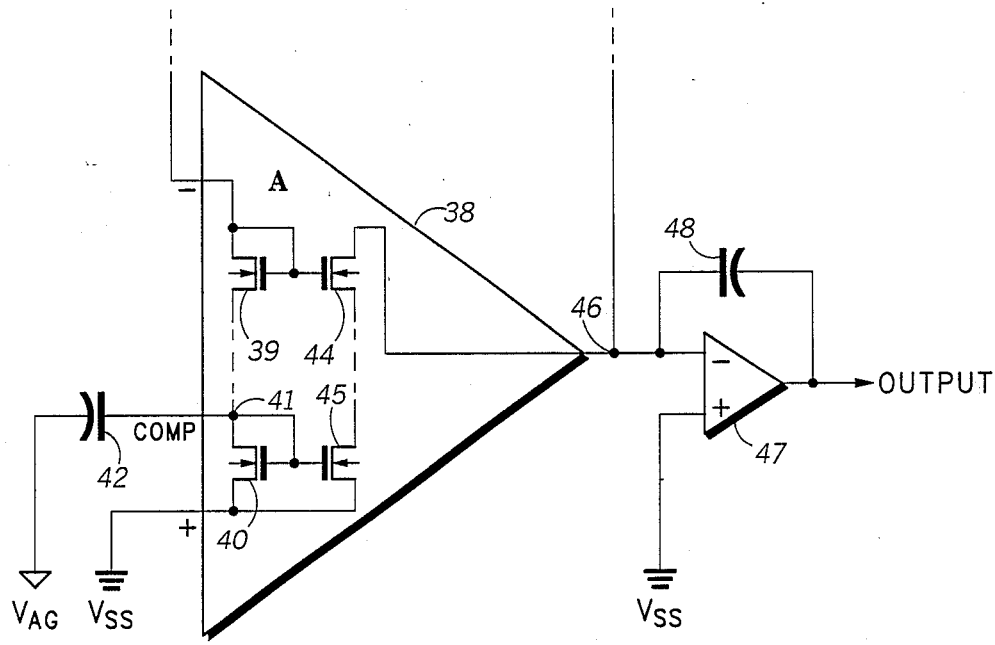

Shown in FIG. 2(B) is a modification of sub-amplifier 25 of FIG. 2(A). A sub-amplifier 38 has an N-channel transistor 39 having a drain connected to a gate thereof and connected to form a negative or inverting input of sub-amplifier 38. In one form, a source of transistor 39 is connected to a drain of an N-channel transistor 40 at a node 41. The drain of transistor 40 is connected to a gate thereof. Node 41 forms a compensation input labeled "Comp" and is connected to a first electrode of a correction capacitor 42. A second electrode of capacitor 42 is connected to an analog ground voltage terminal labeled "$V_{AG}$". A source of transistor 40 forms a positive input of sub-amplifier 38 and is connected to power supply voltage $V_{SS}$. An N-channel transistor 44 has a gate connected to the gate of transistor 39, and a source connected to a drain of an N-channel transistor 45. A gate of transistor 45 is connected to a gate of transistor 40, and a source of transistor 45 is connected to the source of transistor 40 at the positive input of sub-amplifier 38. A drain of transistor 44 provides an output of sub-amplifier 38 and is connected at a node 46 to a negative input of an output amplifier 47. A positive input of output amplifier 47 is connected to power supply voltage $V_{SS}$. An output of output amplifier 47 provides an output signal and is connected to a first terminal of a capacitor 48. A second electrode of capacitor 48 is connected to the negative input of output amplifier 47. In the illustrated form, the negative input and output of sub-amplifier 38 may be respectively connected to the first and second outputs of input stage 14 of FIG. 1 as noted by the dashed lines. Also, transistors 39, 44 and 40, 45 form a cascode structure which may be expanded as noted by the dashed lines with additional cascode pair transistors connected as cascode pair of transistors 39 and 44 are connected. The compensation input of sub-amplifier 30 may also be connected to the gate of any additional cascode transistor which might be inserted between the source of transistor 39 and the drain of transistor 40 instead of being connected to the drain of transistor 39.

In the illustrated form, sub-amplifier 38 of FIG. 2(B) differs from amplifier 25 of FIG. 2(A) by having a different location where the power supply rejection compensation capacitor is connected. In sub-amplifier 38, compensation capacitor is connected to the drain of the lower N-channel transistor, transistor 40, rather than to the negative input of the amplifier as in FIG. 2(A). The theory of operation of power supply rejection in sub-amplifier 38 is the same as for amplifier 25 of FIG. 2(A) with the exception that the compensation current which is conducted by the compensation capacitor does not pass thru the cascode transistor 39, whereas in FIG. 2(A) the current conducted by the compensation capacitor was also conducted by the cascode transistor 26. The same output amplifier structure is used in FIG. 2(B) as is used in FIG. 2(A). In both FIGS. 2(A) and 2(B), an inverting amplifier structure is used at the output of the circuit configuration. Therefore, in order to provide compensation of the power supply noise at the output, and also provide an output which is not inverted, the compensation capacitor is also connected to an input of an inverting sub-amplifier.

Figure 2C:
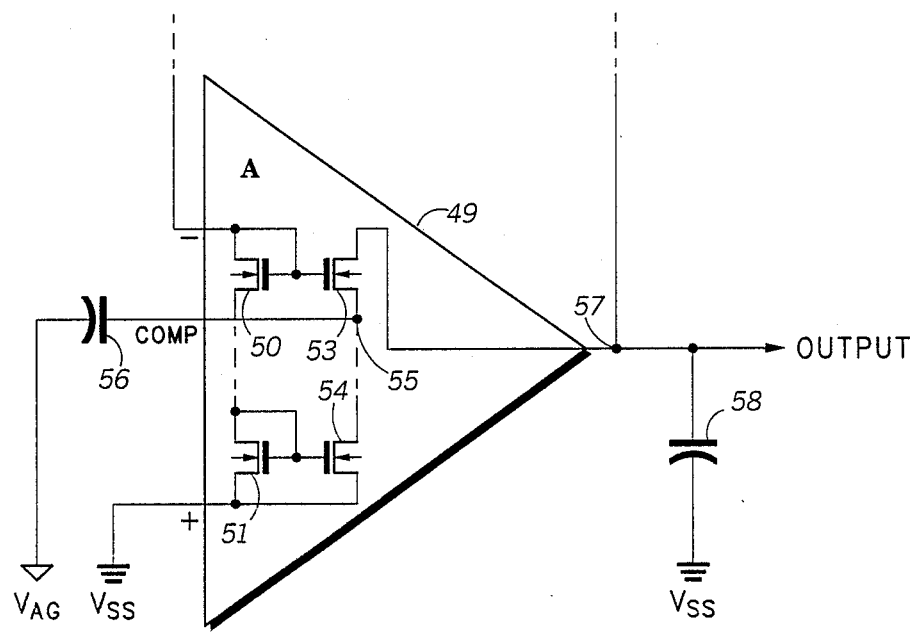

Shown in FIG. 2(C) is yet another modification of amplifier 25 of FIG. 2(A). A sub-amplifier 49 has an N-channel transistor 50 having a drain which forms a negative input of sub-amplifier 49. The drain of transistor 50 is connected to a gate thereof. In one form, a source of transistor 50 is connected to a drain of an N-channel transistor 51. The drain of transistor 51 is connected to a gate thereof. A source of transistor 51 forms a positive input of sub-amplifier 49 and is connected to a power supply voltage terminal $V_{SS}$. An N-channel transistor 53 has a drain which forms an output of sub-amplifier 49, a gate connected to the gate of transistor 50, and a source connected to a drain of an N-channel transistor 54 at a node 55. Node 55 forms a compensation input of sub-amplifier 49 labeled "Comp". A first electrode of a correction capacitor 56 is connected to node 55, and a second electrode of capacitor 56 is connected to a $V_{AG}$ power supply voltage terminal. A gate of transistor 54 is connected to the gate of transistor 51, and a source of transistor 54 is connected to the source of transistor 51. The drain of transistor 53 is connected at a node 57 to a first electrode of an output capacitor 58. A second electrode of capacitor 58 is connected to the $V_{SS}$ power supply voltage terminal. In the illustrated form, the negative input and output of sub-amplifier 49 may be respectively connected to the first and second outputs of input stage 14 of FIG. 1 as noted by the dashed lines. Also, transistors 50, 53 and 51, 54 form a cascode structure which may be expanded as noted by the dashed lines with additional cascode transistors connected as cascode pair transistors 50 and 53. The compensation input can also otherwise be connected to the source of any additional transistor in the current path of transistors 53 and 54 except to the source of transistor 54.

In operation, assume that the power supply error is in the form of an increase in $V_{SS}$ by the amount of $\Delta V$. Thru the coupling of capacitor 58, the output signal at node 57 also increases by $\Delta V$. As the positive input of sub-amplifier 49 also increases by $\Delta V$, transistors 51 and 50 couple the $\Delta V$ to the gate of transistor 50. Since the gate of transistor 53 is connected to the gate of transistor 50, the gate of transistor 53 also varies. The source of transistor 53 will vary the same as its gate. Therefore, node 55 varies by $\Delta V$ and the voltage across correction capacitor 56 is changed. The current conducted by correction capacitor 56 as a result of the power supply variation is sourced by transistor 53 which is connected to the output capacitor 58. Therefore, if the capacitive value of capacitor 58 and associated parasitics is equal to the value of capacitor 56, an amount of charge is pulled off of capacitor 58 thru transistor 53 that is equal to the amount of charge added by variations in power supply voltage $V_{SS}$ to correction capacitor 56. It should again be noted that since output capacitor 58 is coupled to the output and is a noninverting structure, the correction capacitor 56 must be coupled to sub-amplifier 49 so as to not introduce an inversion of the compensation charge.

Figure 3A:
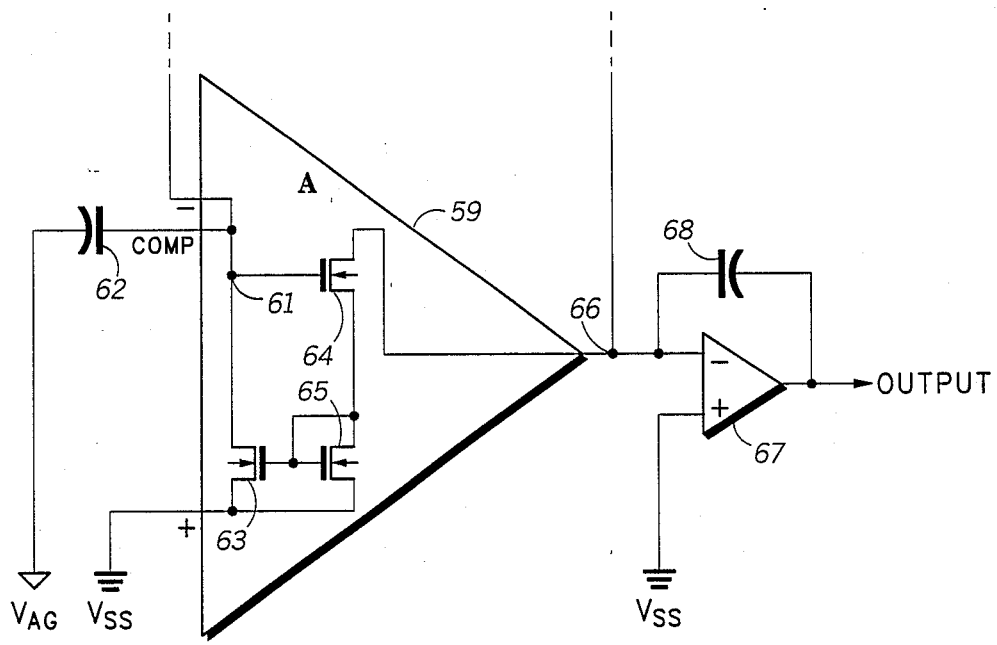
FIG. 3(A) illustrates in partial schematic form a known operational amplifier using a Wilson circuit structure and FIG. 3(B) illustrates in partial schematic form another embodiment of the present invention.

Shown in FIG. 3(A) is another embodiment of amplifier 15 and output portion 12 of FIG. 1. A sub-amplifier 59 has a negative input at a node 61. A compensation input labeled "Comp" is also connected to node 61. A first electrode of a correction capacitor 62 is connected to node 61, and a second electrode of capacitor 62 is connected to a power supply voltage terminal labeled "$V_{AG}$". An N-channel transistor 63 has a drain connected to node 61, a gate, and a source which forms a positive input of amplifier 59. The positive input of sub-amplifier 59 is connected to a power supply voltage terminal labeled "$V_{SS}$". An N-channel transistor 64 has a drain which forms an output of sub-amplifier 59, a gate connected to the drain of transistor 63 at node 61, and a source connected to a drain of an N-channel transistor 65. A gate of transistor 65 is connected to the drain thereof and to the gate of transistor 63. A source of transistor 65 is connected to the source of transistor 63. The drain of transistor 64 is connected at a node 66 to a negative input of an output amplifier 67. A positive input of output amplifier 67 is connected to the power supply voltage terminal labeled "$V_{SS}$". An output of output amplifier 67 provides an output signal. A first electrode of a feedback capacitor 68 is connected to the output of output amplifier 67, and a second electrode of feedback capacitor 68 is connected to node 66. In the illustrated form, the negative input and output of sub-amplifier 59 may be respectively connected to the first and second outputs of input stage 14 of FIG. 1 as noted by the dashed lines.

In operation, the compensation input is again connected internally to the same node which forms the inverting input of the amplifier as in FIG. 2(A). However, in FIG. 3(A) the negative input of sub-amplifier 59 is also the input to a current mirror structure. Therefore, any current conducted via node 61 is mirrored to the output of sub-amplifier 59 thru transistors 64 and 65. Any current pushed into or out of the negative input of sub-amplifier 59 has the same effect at the output of sub-amplifier 59. As in FIG. 2(A), if power supply voltage $V_{SS}$ varies by $\Delta V$, an error voltage is coupled to the output as an error component. Node 61 also varies by the same amount, and substantially the same error charge is added to correction capacitor 62. A resulting proportional current is conducted out of node 61 into capacitor 62. This same current is also conducted out of node 66 thru transistors 64 and 65 which subtracts an amount of charge off of feedback capacitor 68 to exactly cancel the $\Delta V$ increase at the output added by the power supply voltage increase. Therefore, the power supply voltage error is again rejected at the output.

Figure 3B:
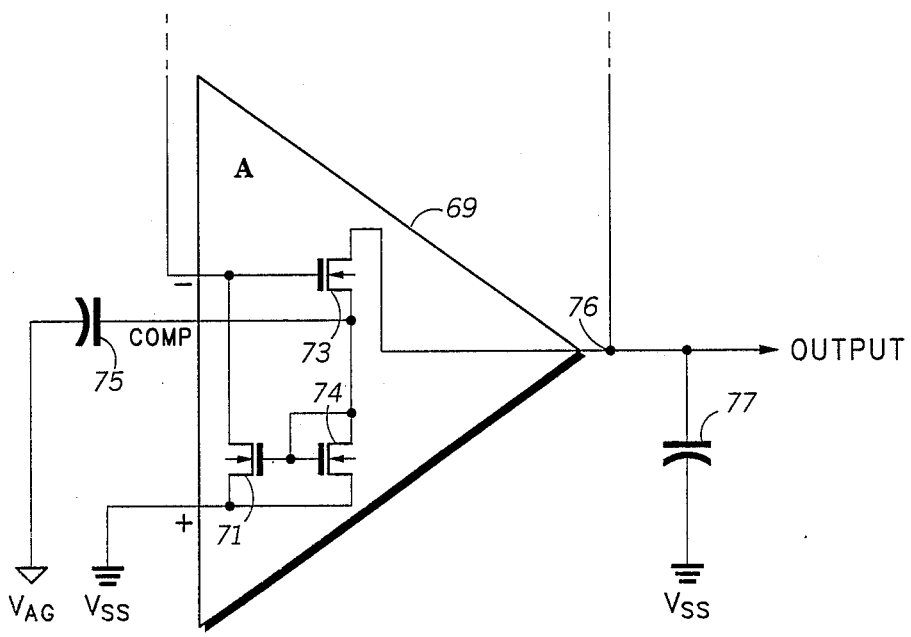

Shown in FIG. 3(B) is a modification of sub-amplifier circuit 59 of FIG. 3(A). A sub-amplifier 69 has an N-channel transistor 71 having a drain which forms a negative input. A source of transistor 71 forms a positive input of sub-amplifier 69. The source of transistor 71 is connected to a power supply voltage $V_{SS}$. An N-channel transistor 73 has a gate connected to the drain of transistor 71, a drain, and a source connected to a drain of an N-channel transistor 74. The drain of transistor 74 is connected to a gate thereof and to the gate of transistor 71. A source of transistor 74 is connected to the source of transistor 71 and power supply voltage $V_{SS}$. The source of transistor 73 provides a compensation input labeled "Comp". A first electrode of a correction capacitor 75 is connected to the source of transistor 73, and a second electrode of correction capacitor 75 is connected to a power supply voltage $V_{AG}$. The drain of transistor 73 provides an output of sub-amplifier 69 and is connected to a node 76 which provides an output of the entire circuit. A first electrode of an output capacitor 77 is connected to node 76, and a second electrode of output capacitor 77 is connected to power supply voltage $V_{SS}$. In the illustrated form, the negative input and output of sub-amplifier 69 may be respectively connected to the first and second outputs of input stage 14 of FIG. 1 as noted by the dashed lines.

In operation, FIG. 3(B) differs from sub-amplifier 59 of FIG. 3(A) by connecting the compensation input to the output stage of sub-amplifier 69. Since output capacitor 77 is a noninverting structure, correction capacitor 75 must be coupled to sub-amplifier 69 in a manner which does not introduce an inversion of the compensation current. Again, any increase in power supply voltage $V_{SS}$ is directly coupled to the output thru output capacitor 77. The increase in voltage at the positive input of sub-amplifier 69 is seen at its negative input and thru the source follower action of transistor 73 at the compensation input. Transistor 73 and capacitor 75 conduct an equal but opposite current necessary to reduce the voltage of output terminal 76 by ΔV which is added by power supply voltage $V_{SS}$. Again, the capacitive value of correction capacitor 75 should be ratioed to match the value of output capacitor 77 plus associated parasitic capacitance at the output. In all of the illustrations of FIGS. 2 and 3, the same bias current configuration to the negative input and output of the amplifier structure "A" have been illustrated.

Figure 4A:
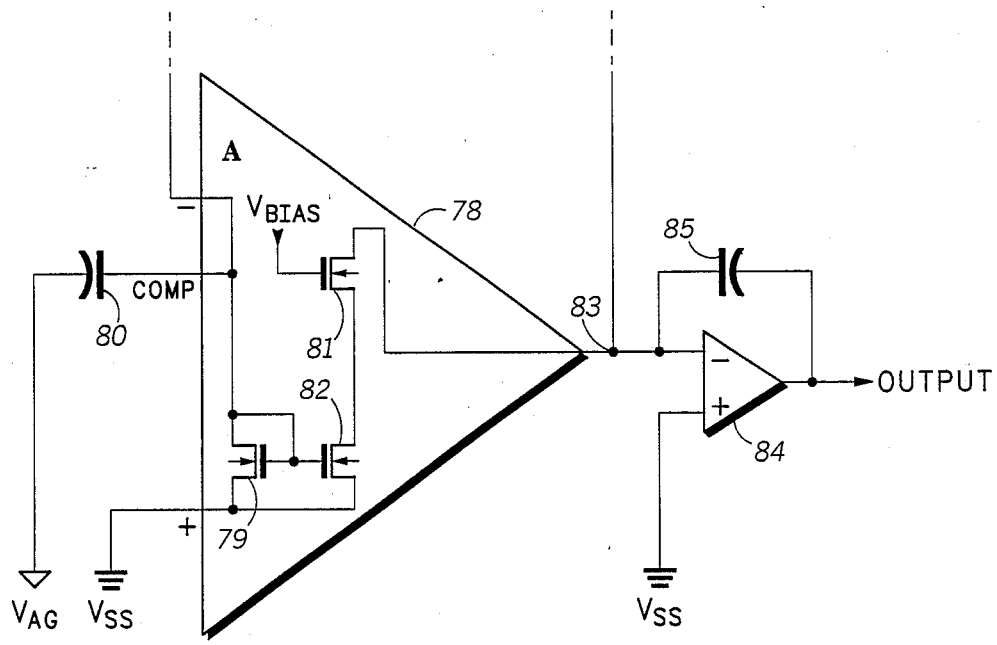
FIG. 4(A) illustrates in partial schematic form a known operational amplifier and FIG. 4(B) illustrates in partial schematic form another embodiment of the present invention.

Shown in FIG. 4(A) is yet another embodiment of amplifier 15 and output portion 12 of FIG. 1. A sub-amplifier 78 has a negative input which is formed by a drain of an N-channel transistor 79. A gate of transistor 79 is connected to the drain of transistor 79 which also functions as a compensation input labeled "Comp". Transistor 79 has a source which forms a positive input of sub-amplifier 78. The positive input of sub-amplifier 78 is connected to power supply voltage $V_{SS}$. A first electrode of a correction capacitor 80 is connected to the drain and gate of transistor 79, and a second electrode of capacitor 80 is connected to a power supply voltage terminal for receiving a power supply voltage labeled "$V_{AG}$". An N-channel transistor 81 has a drain, a gate connected to a bias voltage labeled "$V_{Bias}$", and a source connected to a drain of an N-channel transistor 82. A gate of transistor 82 is connected to the gate of transistor 79, and a source of transistor 82 is connected to the source of transistor 79. The drain of transistor 81 forms an output of sub-amplifier 78 and is connected to a node 83. An output amplifier 84 has a negative input connected to node 83, a positive input connected to power supply voltage $V_{SS}$, and an output for providing an output signal. A first electrode of a feedback capacitor 85 is connected to the output of output amplifier 84, and a second electrode of feedback capacitor 85 is connected to the negative input of output amplifier 84. In the illustrated form, the negative input and output of sub-amplifier 78 may be respectively connected to the first and second outputs of input stage 14 of FIG. 1 as noted by the dashed lines.

In operation, sub-amplifier 78 functions similarly to operational amplifier circuit 10 of FIG. 1. In particular, power supply voltage variations in $V_{SS}$ are coupled directly onto the output terminal. The power supply variation also causes transistor 79 and correction capacitor 80 to conduct an additional current. The current thru transistor 79 is mirrored to transistors 81 and 82 which supply feedback capacitor 85 with a charge which when integrated onto feedback capacitor 85 either adds to or subtracts from the error voltage already existent at the output of output amplifier 84, thereby nulling the power supply error. The fixed bias voltage applied to the gate of transistor 81 may be referenced to either $V_{AG}$ or $V_{SS}$.

Figure 4B:
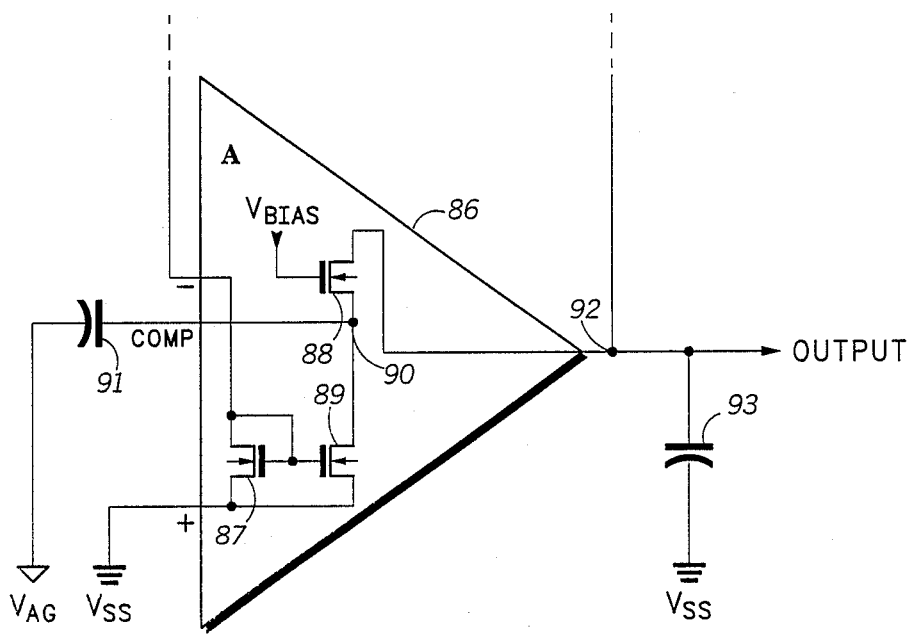

Shown in FIG. 4(B) is a modification of the sub-amplifier 78 configuration of FIG. 4(A). A sub-amplifier 86 has an N-channel transistor 87 having a drain which forms a negative input of sub-amplifier 86. The drain of transistor 87 is connected to a gate thereof, and a source of transistor 87 forms a positive input of sub-amplifier 86. The positive input of sub-amplifier 86 is connected to power supply voltage $V_{SS}$. An N-channel transistor 88 has a drain, a gate connected to a bias voltage labeled "$V_{Bias}$", and a source connected to a drain of an N-channel transistor 89 at a node 90. Node 90 forms a compensation input of sub-amplifier 86 labeled "Comp". A first electrode of a correction capacitor 91 is connected to node 90, and a second electrode of correction capacitor 91 is connected to power supply voltage $V_{AG}$. A gate of transistor 89 is connected to the gate of transistor 87, and a source of transistor 89 is connected to power supply voltage $V_{SS}$. A drain of transistor 88 provides an output of sub-amplifier 86 and is connected to a node 92. A first electrode of an output capacitor 93 is connected to node 92, and a second electrode of output capacitor 93 is connected to power supply voltage $V_{SS}$. In the illustrated form, the negative input and output of sub-amplifier 86 may be respectively connected to the first and second outputs of transconductance input stage 14 of FIG. 1 as noted by the dashed lines.

In operation, the output capacitor 93 is a noninverting structure. Therefore correction capacitor 91 must be connected internally to sub-amplifier 86 in a manner which does not introduce an inversion of a compensation current provided by correction capacitor 91. In the illustrated form, the bias voltage connected to the gate of transistor 88 is referenced to power supply voltage $V_{SS}$. As supply voltage $V_{SS}$ varies, the source of transistor 88 also varies since the $V_{Bias}$ voltage varies directly with $V_{SS}$. Therefore, a current is conducted by correction capacitor 91 thru transistor 88 which thru charge transfer will either add to or subtract from the error voltage placed across capacitor 93 to effectively reject the power supply noise from appearing in the output signal.

Figure 5A:
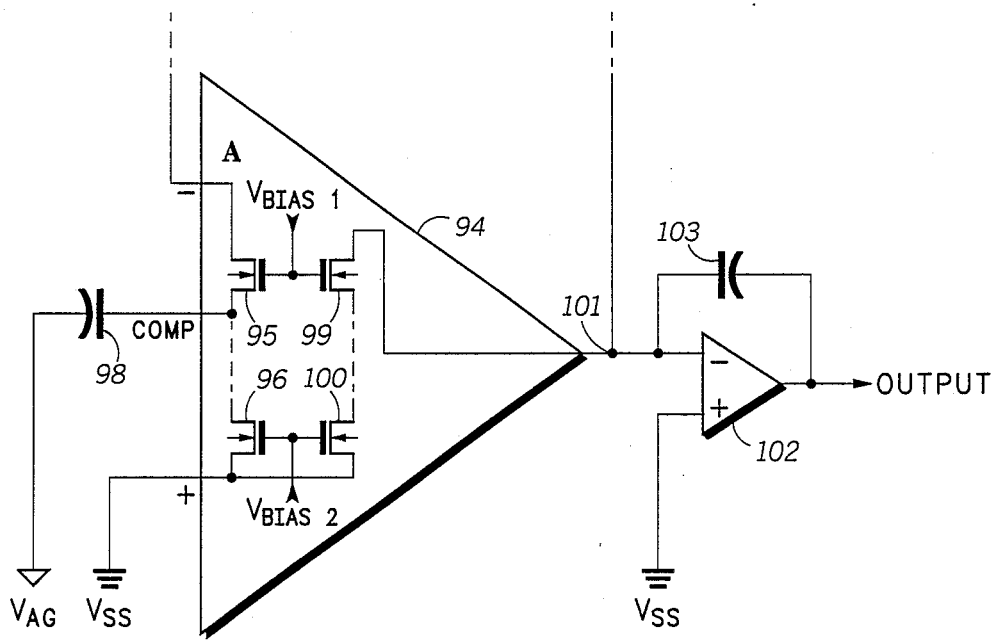
FIG. 5(A) and 5(B) illustrate in partial schematic form another embodiment of the present invention using cascode circuit structures with multiple bias voltages.

Shown in FIG. 5(A) is a further modification of amplifier 15 and output portion 12 of FIG. 1. A sub-amplifier 94 comprises an N-channel transistor 95 having a drain which forms a negative input of sub-amplifier 94. A gate of transistor 95 is connected to a first bias voltage labeled "$V_{Bias\ 1}$", and has a source connected to a drain of an N-channel transistor 96 at a compensation input node labeled "Comp". A source of transistor 96 forms a positive input of sub-amplifier 94 which is connected to power supply voltage $V_{SS}$. A gate of transistor 96 is connected to a second bias voltage labeled "$V_{Bias\ 2}$". A first electrode of a correction capacitor 98 is connected to the compensation input node, and a second electrode of correction capacitor 98 is connected to power supply voltage $V_{AG}$. An N-channel transistor 99 has a drain which forms an output of sub-amplifier 94, a gate connected to the gate of transistor 95 and to bias voltage $V_{Bias\ 1}$, and a source. An N-channel transistor 100 has a drain connected to the source of transistor 99, a gate connected to the gate of transistor 96 and bias voltage $V_{Bias\ 2}$, and a source connected to the source of transistor 96. The drain of transistor 99 is connected to a negative input of an output amplifier 102 at a node 101. Output amplifier 102 has a positive input connected to power supply voltage $V_{SS}$, and has an output. A feedback capacitor 103 has a first electrode connected to the output of output amplifier 102, and has a second electrode connected to the negative input of output amplifier 102. In the illustrated form, the negative input and output of sub-amplifier 94 may be respectively connected to first and second terminals of a current mirror circuit such as current mirror 130 illustrated in FIG. 6.

Figure 6:
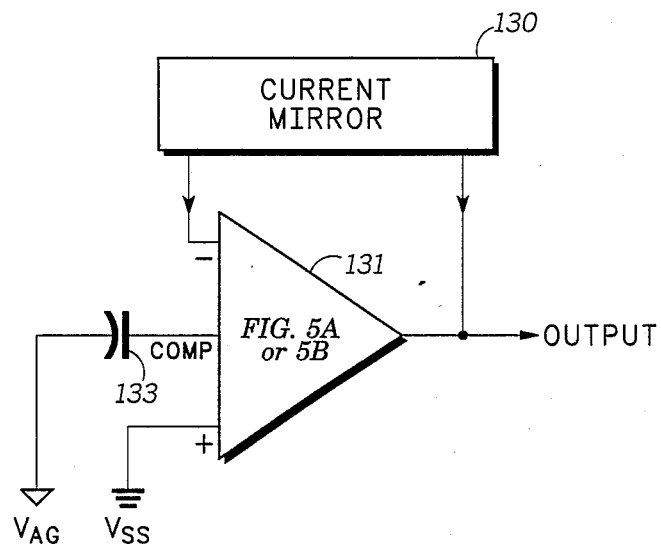
FIG. 6 illustrates in partial schematic form a circuit arrangement for use with the present invention as illustrated in FIGS. 5(A) or (B)

In operation, again assume that the power supply noise error is in the form of an increase in $V_{SS}$ potential. As a result, the input voltage of output amplifier 102 increases by an amount ΔV which is coupled thru feedback capacitor 103 to the output. The bias voltage $V_{Bias\ 1}$ and $V_{Bias\ 2}$ are generated with respect to $V_{SS}$. When the bias voltages $V_{Bias\,1}$ and $V_{Bias\,2}$ of sub-amplifier 94 increase by $\Delta V$, so does the source of transistor 95 because the gate of transistor 95 also increases by $\Delta V$. As a result, a compensation current is conducted thru transistor 95 and correction capacitor 98 proportional to the error voltage coupled by feedback capacitor 103 to the output. The compensation current thru transistor 95 is mirrored across to node 101 thru circuitry external to sub-amplifier 94 connected to the negative input and output of sub-amplifier 94 as shown in FIG. 6. If capacitor 98 is substantially equal in value to the capacitance of correction capacitor 103 and associated parasitic capacitance, the power supply noise is substantially cancelled at the output of amplifier 102.

Alternatively, the amplifier circuit in FIG. 6 may be implemented by what is commonly referred to as a folded cascode configuration. In a folded cascode configuration, the input signal may be coupled to both the negative input and the output of sub-amplifier 94, to some internal nodes of the current mirror, or to the drains of $V_{SS}$ connected transistors in the sub-amplifier such as transistors 96 and 100 of sub-amplifier 94.

Figure 5B:
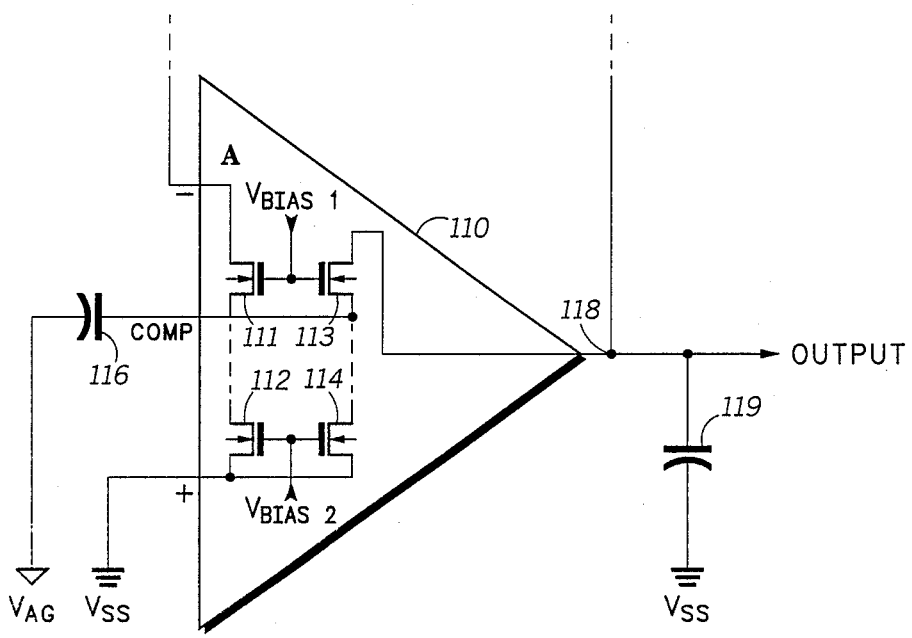

Shown in FIG. 5(B) is another variation of the embodiment of FIG. 5(A) utilizing two bias voltages. A sub-amplifier 110 has an N-channel transistor 111 having a drain which forms a negative input of sub-amplifier 110. A gate of transistor 111 is connected to a first bias voltage "$V_{Bias\,1}$", and a source of transistor 111 is connected to a drain of an N-channel transistor 112. A gate of transistor 112 is connected to a second bias voltage "$V_{Bias\,2}$". A source of transistor 112 form a positive input of amplifier 110 which is connected to power supply voltage $V_{SS}$. An N-channel transistor 113 has a drain which provides an output of sub-amplifier 110, a gate which is connected to both the gate of transistor 111 and the first bias voltage $V_{Bias\,1}$. A source of transistor 113 is connected to a drain of an N-channel transistor 114 at a compensation node labeled "Comp". The compensation node functions as a compensation input of sub-amplifier 110. A gate of transistor 114 is connected to both the gate of transistor 112 and the second bias voltage $V_{Bias\,2}$. A source of transistor 114 is connected to the source of transistor 112. A first electrode of a correction capacitor 116 is connected to the compensation input of sub-amplifier 110 at the compensation node, and a second electrode of capacitor 116 is connected to power supply voltage $V_{AG}$. The drain of transistor 113 is connected to a first electrode of an output capacitor 119 at a node 118. A second electrode of output capacitor 119 is connected to power supply voltage $V_{SS}$. In the illustrated form, the negative input and output of sub-amplifier 110 may be respectively connected to the first and second outputs of input stage 14 of FIG. 1 as noted by the dashed lines.

In operation, the correction capacitor 116 is connected to the compensation node in the output portion of sub-amplifier 110. As a result, no inversion of the compensation current provided by sub-amplifier 110 occurs and a noninverting output portion, such as output capacitor 119, may be used. In the illustrated form, the bias voltages connected to the gates of transistors 111–114 are references to power supply voltage $V_{SS}$. As power supply voltage $V_{SS}$ varies, the gates of transistors 111–114 also vary. In response thereto, the source of transistor 113 varies accordingly and transistor 113 either sources or sinks a current to or from node 118 to correction capacitor 116. Therefore, a current is conducted by correction capacitor 116 which will either add to or subtract from the error voltage across output capacitor 119 to effectively reject the power supply noise from appearing in the output signal. Again, correction capacitor 116 should have a value equal to the capacitance of output capacitor 119 and the associated parasitic capacitance.

As mentioned above, FIG. 6 is a variation of the circuit configuration and may be used with the amplifier configurations of either FIG. 5(A) or (B). A sub-amplifier structure 131 is illustrated having negative, compensation and positive inputs and an output. Sub-amplifier 131 represents either the sub-amplifier of FIG. 5(A) excluding output amplifier 102 or represents the entire circuit configuration of FIG. 5(B). In the illustrated form, a current mirror circuit 130 has a first terminal or first bias current leg connected to the negative input of sub-amplifier 131, and a second terminal or second bias current leg connected to the output of sub-amplifier 131. A correction capacitor 133 has a first electrode connected to the compensation input of amplifier 131, and has a second electrode connected to power supply voltage $V_{AG}$. It should be noted that current mirror circuit 130 may be implemented by various circuit structures of varying complexity.

Assume that sub-amplifier 94 of FIG. 5(A) is utilized as sub-amplifier 131 in FIG. 6. The two terminals of current mirror 130 represent the two connections illustrated in FIG. 5(A) at the negative input and the output of amplifier 94. Current mirror 130 functions to mirror the current being conducted by transistors 95 and 96 to node 101 as described above. It should be noted that a current mirror structure does not have to be used with the amplifier structure of FIG. 5(B) as a circuit which provides bias currents to the negative input and output of sub-amplifier 110 will allow sub-amplifier 110 to function as described above. In such a configuration, transistors 111 and 112 may be removed and the negative input of sub-amplifier 110 would not exist.

Figure 7:
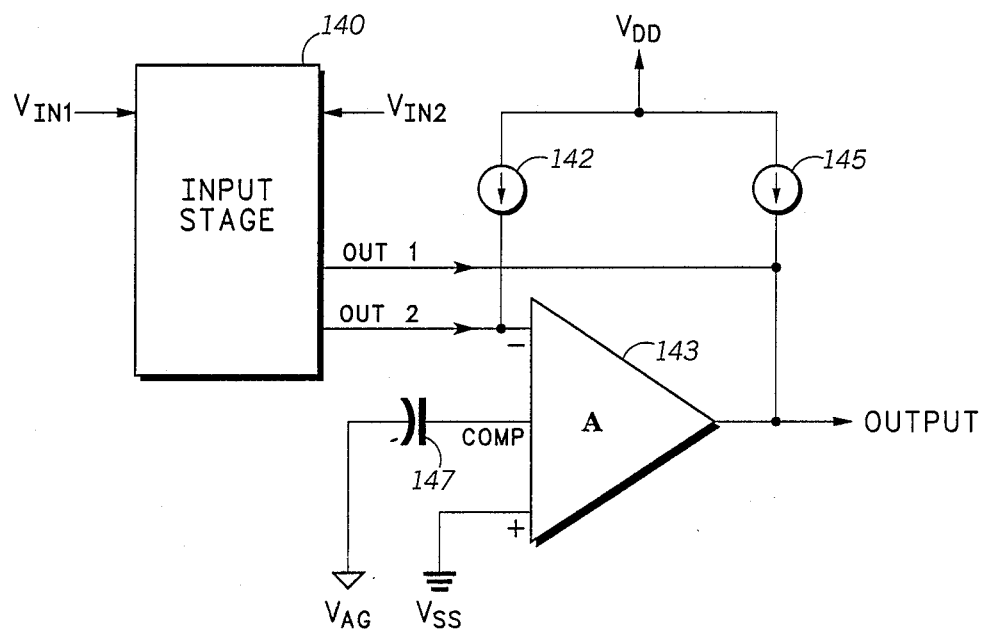
FIG. 7 illustrates in partial schematic form another circuit arrangement for use with the present invention.

Shown in FIG. 7 is another variation of the circuit configuration which may be used with the present invention. A sub-amplifier 143 is illustrated and may be implemented with any of the "A" labeled amplifier structures of FIGS. 1–4 and 5(B). An input stage 140 is shown having first and second inputs for respectively receiving first and second input voltages, $V_{IN1}$ and $V_{IN2}$, and first and second outputs, "Out 1" and "Out 2". A current source 142 has a first terminal connected to power supply voltage $V_{DD}$, and a second terminal connected to both the second output of input stage 140 and a negative input of sub-amplifier 143. A current source 145 has a first terminal connected to power supply voltage $V_{DD}$, and a second terminal connected to both the first output of input stage 140 and an output of sub-amplifier 143 which provides an output signal. A correction capacitor 147 has a first electrode connected to a compensation input of sub-amplifier 143 labeled "Comp", and has a second electrode connected to power supply voltage $V_{AG}$. A positive input of sub-amplifier 143 is connected to power supply voltage $V_{SS}$.

In the illustrated form, current sources 142 and 145 each provide a predetermined source current. However, in FIG. 7 as contrasted with FIGS. 1 or 6, the current mirror circuitry is illustrated as being independent from an input structure such as transconductance input stage 140. It should be readily noted that input stage 140 may be implemented with either two inputs for receiving first and second input signals, respectively, as shown or with only a single input for receiving a single input signal. Sub-amplifier 143 may be implemented with any of the amplifier structures of FIGS. 1-4 and 5(B) and the operation is as previously described.

Figure 8:
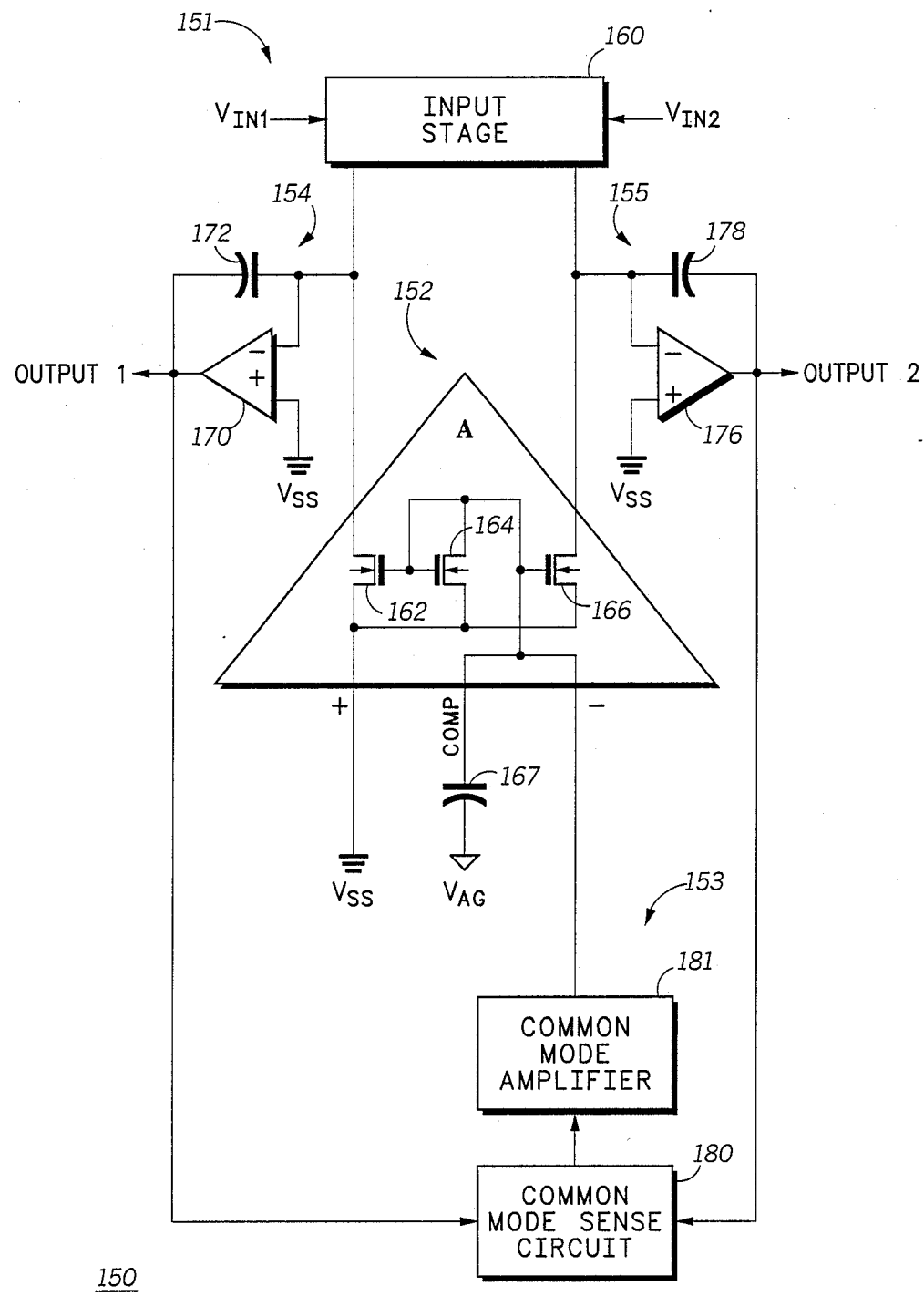
FIG. 8 illustrates in partial schematic form an operational amplifier in a fully differential configuration.

Shown in FIG. 8 is a fully differential input, fully differential output amplifier 150. Generally, amplifier 150 comprises an input portion 151, a compensated sub-amplifier portion 152, a common-mode feedback portion 153, and first and second output portions 154 and 155. Input portion 151 has an input stage having first and second inputs for respectively receiving first and second input voltages, $V_{IN1}$ and $V_{IN2}$. Input stage 160 has first and second outputs.

Compensated sub-amplifier portion 152 has an N-channel transistor 162 having a drain thereof connected to the first output of input stage 160. The drain of transistor 162 functions as a first output of compensated sub-amplifier portion 152. A source of transistor 162 forms a positive input of compensated sub-amplifier portion 152. A gate of transistor 162 is connected to a gate of an N-channel transistor 164. A source of transistor 164 is connected to the source of transistor 162. The gate of transistor 164 is also connected to a drain thereof and to a gate of an N-channel transistor 166. The gate of transistor 166 forms both a negative input and a compensation input labeled "Comp" of compensated sub-amplifier portion 152. A first electrode of a correction capacitor 167 is connected to the gate of transistor 166, and a second electrode of correction capacitor 167 is connected to power supply voltage $V_{AG}$. A source of transistor 166 is connected to the sources of transistors 162 and 164. A drain of transistor 166 functions as a second output of sub-amplifier portion 152 and is connected to the second output of input stage 160.

First output portion 154 comprises an amplifier 170 having a negative input connected to the first output of sub-amplifier portion 152 at the drain of transistor 162, a positive input connected to power supply voltage $V_{SS}$, and an output. A feedback capacitor 172 has a first electrode connected to a negative input, and a second electrode connected to the output of amplifier 170 which provides a first output signal labeled "Output 1".

Second output portion 155 comprises an amplifier 176 having a negative input connected to the second output of sub-amplifier portion 152 at the drain of transistor 166. Amplifier 176 has a positive input connected to power supply voltage $V_{SS}$, and an output. A feedback capacitor 178 has a first electrode connected to the negative input of amplifier 176, and has a second electrode connected to the output of amplifier 176 for providing a second output signal labeled "Output 2".

Common-mode feedback portion 153 comprises a common-mode sense circuit having a first input connected to the output of amplifier 170 and having a second input connected to the output of amplifier 176. An output of common-mode sense circuit 180 is connected to an input of a common-mode amplifier 181. An output of common-mode amplifier 181 is connected to the negative input of compensated amplifier portion 152.

In operation, sub-amplifier 152 functions similarly in principle to sub-amplifier 15 of FIG. 1. Sub-amplifier 152 has been expanded from sub-amplifier 15 by coupling two transistors to transistor 164 rather than using only a single transistor at the analogous location in FIG. 1. Basically, as power supply voltage $V_{SS}$ varies, an error voltage is coupled onto the first and second output terminals, respectively. The $V_{SS}$ variation at the positive input of sub-amplifier 152 causes correction capacitor 167 and thus each of transistors 162 and 166 to conduct an amount of compensation current to either add to or subtract from the voltage present on feedback capacitors 172 and 178, respectively. Correction capacitor 167 has a capacitive value which is ratioed, in one form, to be the same capacitive value as one of capacitors 172 and 178 plus associated parasitic capacitance associated with the selected one capacitor. The compensation current cancels the power supply noise at the first and second outputs, respectively. Transistors 162, 164 and 166 are sized ratioed so that the proper compensation current is coupled to both of the output portions 154 and 155 should capacitors 172 and 178 not have the same capacitive value and associated parasitic capacitances. The common-mode sense circuit 180 and common-mode amplifier 181 may be implemented with conventional circuitry for establishing and maintaining a predetermined output common-mode voltage. For example, common-mode sense circuit 180 may be implemented by a resistor divider network, and amplifier 181 may be implemented as a simple transistor differential amplifier. It should be well understood that any type of common-mode circuitry may be utilized in connection with the present invention.

As illustrated, it should be readily apparent that any of the embodiments of sub-amplifier A described herein may be implemented with multiple outputs. Although two outputs are illustrated in FIG. 8, it should be apparent that amplifier 150 may be implemented with any number of plural outputs. Typically, in a fully differential amplifier structure there is no problem associated with power supply noise being coupled to the output common-mode signal because the noise is rejected by virtue of the differential nature of the circuit. However, in an application where only a single output of a differential or multiple output structure is being utilized and the output is referenced to $V_{AG}$, common-mode noise is a problem at the output. Therefore, the compensation of the present invention may be utilized to cancel power supply noise in such applications as well.

By now it should be apparent that a method and a variety of circuit implementations have been provided to accomplish power supply noise rejection with a single ratioed capacitor provided in a signal path of the amplifier. The present invention essentially requires only an additional capacitor to be added to an amplifier as compared with previously known power supply rejection circuits which added significantly more circuitry to compensate for power supply errors. Further, the present invention is versatile enough to be capable of being used in a wide variety of amplifier configurations.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An amplifier having high power supply noise rejection for use with first and second power supply voltages, comprising:
    an output portion for providing an output signal substantially without any error component caused by power supply voltage variation, said output portion being coupled to at least one power supply voltage terminal for receiving at least a first of the power supply voltages, and having a capacitive element which inadvertently couples an error voltage proportional to the variation of a second of the two power supply voltages;

an amplifier portion having first and second inputs, and an output, said first input and said output both coupled to an input signal component and respectively coupled to first and second bias currents, said second input connected to a terminal adapted to receive the second power supply voltage, said output coupling an intermediate signal to the output portion having both an output signal component and a compensation component, said compensation component having a magnitude substantially equal to and opposite in polarity of the error voltage;

a correction capacitor having a first electrode connected to an internal mode of the amplifier portion which does not function as an input terminal of the amplifier portion, and a second electrode connected to a third power supply voltage terminal for receiving a third power supply voltage which references the output signal and which has a magnitude substantially midway between the first and second power supply voltages, said correction capacitor having a predetermined capacitive value ratioed to the capacitive element of the output portion and conducting a compensation current away from the output portion; and an input stage coupled to the first input and output of the amplifier portion, said input stage providing the input signal component in response to an input signal and providing the first and second bias currents.

2. The amplifier of claim 1 wherein said amplifier portion further comprises:

a first transistor having a first current electrode coupled to the first input, a control electrode coupled to the first current electrode thereof, and a second current electrode;

a second transistor having a first current electrode coupled to the second current electrode of the first transistor, a control electrode coupled to the first current electrode thereof, and a second current electrode coupled to one of the power supply voltages;

a third transistor having a first current electrode coupled to the output of the amplifier portion, a control electrode coupled to the control electrode of the first transistor, and a second current electrode coupled to the first electrode of the correction capacitor at the internal node; and a fourth transistor having a first current electrode coupled to the second current electrode of the third transistor, a control electrode coupled to the control electrode of the second transistor, and a second current electrode coupled to the second current electrode of the second transistor.

3. The amplifier of claim 1 wherein said input stage provides the first and second bias currents independent of the input signal component which is provided in response to both a first input signal and a second input signal.

4. The amplifier of claim 1 wherein said output portion further comprises:

an operational amplifier having a first input coupled to the first current electrode of the third transistor, a second input coupled to one of the power supply voltages; and an output for providing the output signal; and said capacitive element comprising a second capacitor having a first electrode coupled to the first input of the operational amplifier, and a second electrode coupled to the output of the operational amplifier.

5. The amplifier of claim 1 wherein the amplifier portion further comprises:

a first transistor having a first current electrode coupled to a control electrode thereof and to the first input of the amplifier portion, and having a second current electrode;

a second transistor having a first current electrode coupled to a control electrode thereof and to both the first electrode of the correction capacitor and the second current electrode of the first transistor, and having a second current electrode coupled to one of the power supply voltages;

a third transistor having a first current electrode coupled to the output of the amplifier portion, a control electrode coupled to the control electrode of the first transistor, and a second current electrode; and a fourth transistor having a first current electrode coupled to the second current electrode of the third transistor, a control electrode coupled to the control electrode of the second transistor, and a second current electrode coupled to the second current electrode of the second transistor.

6. The amplifier of claim 1 wherein the amplifier portion further comprises:

a first transistor having a first current electrode coupled to the output of the amplifier portion, having a control electrode coupled to the first input of the amplifier portion, and having a second current electrode;

a second transistor having a first current electrode coupled to a control electrode thereof and to both the second current electrode of the first transistor and the first electrode of the correction capacitor at the internal node, and having a second current electrode coupled to the at least one power supply voltage terminal; and a third transistor having a first current electrode coupled to the first input of the amplifier portion, a control electrode coupled to the control electrode of the second transistor, and a second current electrode coupled to the second current electrode of the second transistor.

7. The amplifier of claim 6 wherein said output portion is an output capacitor having a first electrode coupled to the output of the amplifier portion, and a second electrode coupled to the second power supply voltage terminal.

8. The amplifier of claim 1 wherein the amplifier portion further comprises:

a first transistor having a first current electrode coupled to the first input of the amplifier portion, a control electrode coupled to a first bias voltage, and having a second current electrode coupled to the first electrode of the correction capacitor;

a second transistor having a first current electrode coupled to the second current electrode of the first transistor, a control electrode coupled to a second bias voltage, and having a second current electrode coupled to the second input of the amplifier portion;

a third transistor having a first current electrode coupled to the output of the amplifier portion, a control electrode coupled to the control electrode of the first transistor, and a second current electrode; and a fourth transistor having a first current electrode coupled to the second current electrode of the third transistor, a control electrode coupled to the control electrode of the second transistor, and a second current electrode coupled to the second input of the amplifier portion.

9. The amplifier of claim 1 wherein said amplifier portion further comprises:

a first transistor having a first current electrode coupled to the first input of the amplifier portion, a control electrode for receiving a first bias voltage, and a second current electrode;

a second transistor having a first current electrode coupled to the second current electrode of the first transistor, a control electrode for receiving a second bias voltage, and a second current electrode coupled to the second input of the amplifier portion;

a third transistor having a first current electrode coupled to the output of the amplifier portion, a control electrode coupled to the control electrode of the first transistor, and a second current electrode coupled to the first electrode of the correction capacitor, and a fourth transistor having a first current electrode coupled to the second current electrode of the third transistor, a control electrode coupled to the control electrode of the second transistor, and a second current electrode coupled to the second current electrode of the second transistor.

10. The amplifier of claim 9 wherein said output portion is an output capacitor having a first electrode coupled to the output of the amplifier portion, and a second electrode coupled to the second power supply voltage terminal.

11. The amplifier of claim 1 wherein said input stage further comprises:

an input circuit having first and second input terminals for respectively receiving first and second input signals, and first and second outputs for providing first and second output signals proportional to the first and second input signals; and a bias circuit comprising a first current source having a first terminal coupled to the first power supply voltage terminal, and having a second terminal coupled to both the first output of the input circuit and the output of the amplifier portion, and comprising a second current source having a first terminal coupled to the first power supply voltage terminal, and having a second terminal coupled to both the second output of the input circuit and the first input of the amplifier portion.

12. A method of rejecting power supply noise in an operational amplifier circuit, comprising the steps of:

coupling an output circuit to at least one of first and second power supply voltage terminals respectively adapted to receive first and second power supply voltages, said output circuit having a capacitive element for coupling an inadvertent error voltage proportional to the variation of the second power supply voltage;

providing an amplifier having first and second inputs, and an output coupled to the output circuit;

coupling first and second bias currents and an input signal component proportional to an input signal to the first input and output, respectively, of the amplifier;

connecting a first electrode of a correction capacitor to an internal node of the amplifier which does not function as an input of the amplifier and connecting a second electrode of the correction capacitor to a reference voltage terminal coupled to an output signal reference voltage substantially halfway between the first and second power supply voltages, said correction capacitor and amplifier conducting a compensation current away from the output stage to charge cancel an error voltage coupled to the output of the output stage by the capacitive element of the output circuit caused by power supply noise; and ratioing the correction capacitor's capacitance to the capacitive element of the output circuit.

13. The method of claim 12 further comprising the step of;

providing the first and second bias currents which are coupled to the amplifier in response to receiving both a first and a second input signal.

14. An amplifier having high power supply noise rejection for use with first and second power supply voltages, comprising:

an output terminal for providing an output signal substantially without any error component caused by power supply voltage variation, the output terminal being coupled to at least one power supply voltage terminal for receiving a first of the power supply voltages, and having a capacitive element coupled thereto which inadvertently couples an error voltage proportional to the variation of a second of the two power supply voltages;

an amplifier having first and second inputs, and an output, said amplifier comprising a first pair of transistors forming a first current mirror pair of transistors coupled to a second pair of transistors forming a second current mirror pair of transistors via first and second conduction paths, said first input for receiving an input signal, said second input for receiving the second power supply voltage, and said output for providing a compensated output signal which is compensated for variations in the second power supply voltage; and a compensation capacitor having a first electrode directly connected to a node in one of said conduction paths between the first and second pairs of transistors, and a second electrode coupled to a third power supply voltage terminal for receiving a third power supply voltage which references the output signal, said correction capacitor conducting a compensation current away from the output terminal when the second power supply voltage increases in magnitude.

* * * * *